United States Patent
Mondelli et al.

(10) Patent No.: US 10,917,194 B2
(45) Date of Patent: Feb. 9, 2021

(54) SYSTEMS AND METHODS FOR RATE-COMPATIBLE POLAR CODES FOR GENERAL CHANNELS

(71) Applicants: TELEFONAKTIEBOLAGET LM ERICSSON (PUBL), Stockholm (SE); EIDGENÖSSISCHE TECHNISCHE HOCHSCHULE ZÜRICH, Zurich (CH); ECOLE POLYTECHNIQUE FEDERALE DE LAUSANNE (EPFL) EPFL-TTO, Lausanne (CH)

(72) Inventors: Marco Mondelli, San Francisco, CA (US); Hamed Hassani, Philadelphia, PA (US); Ivana Maric, Stanford, CA (US); Songnam Hong, Yongin-si (KR); Dennis Hui, Sunnyvale, CA (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/347,436

(22) PCT Filed: Nov. 3, 2017

(86) PCT No.: PCT/IB2017/056876
§ 371 (c)(1),
(2) Date: May 3, 2019

(87) PCT Pub. No.: WO2018/083647
PCT Pub. Date: May 11, 2018

(65) Prior Publication Data
US 2020/0235851 A1    Jul. 23, 2020

Related U.S. Application Data

(60) Provisional application No. 62/416,949, filed on Nov. 3, 2016.

(51) Int. Cl.
*H04L 1/00* (2006.01)
*H04L 1/16* (2006.01)
(Continued)

(52) U.S. Cl.
CPC .......... *H04L 1/0057* (2013.01); *H03M 13/13* (2013.01); *H03M 13/616* (2013.01); *H04L 1/0041* (2013.01); *H04L 1/1657* (2013.01)

(58) Field of Classification Search
CPC ... H04L 1/0057; H04L 1/0041; H04L 1/1657; H03M 13/13; H03M 13/616
See application file for complete search history.

(56) References Cited

U.S. PATENT DOCUMENTS

| | | |
|---|---|---|
| 2007/0253423 A1 | 11/2007 | Chindapol et al. |
| 2015/0091742 A1* | 4/2015 | Ionita ............... H03M 13/251 341/57 |

(Continued)

FOREIGN PATENT DOCUMENTS

| | | |
|---|---|---|
| EP | 3264651 A1 | 1/2018 |
| WO | 2016154972 A1 | 10/2016 |

OTHER PUBLICATIONS

M. El-Khamy, H. Lin, J. Lee, H. Mandavifar and I. Kang, "HARQ Rate-Compatible Polar Codes for Wireless Channels," 2015 IEEE Global Communications Conference (GLOBECOM), San Diego, CA, 2015, pp. 1-6. (Year: 2015).*

(Continued)

*Primary Examiner* — Kyle Vallecillo

(57) ABSTRACT

According to certain embodiments, a transmit node in a wireless communications system includes a first universal rate-compatible polar encoder and a transmitter. The first universal rate-compatible polar encoder is configured for a family of two or more types of channels and encodes a plurality of information bits to provide a plurality of coded (Continued)

bits. The transmitter transmits the plurality of coded bits to a receive node.

28 Claims, 10 Drawing Sheets

(51) Int. Cl.
*H03M 13/13* (2006.01)
*H03M 13/00* (2006.01)

(56) References Cited

U.S. PATENT DOCUMENTS

| | | | |
|---|---|---|---|
| 2017/0324514 A1* | 11/2017 | Shen | H04L 1/0061 |
| 2018/0013517 A1* | 1/2018 | Rong | H04L 1/0057 |
| 2018/0026751 A1* | 1/2018 | Li | H04L 1/0057 |
| | | | 714/751 |
| 2019/0103883 A1* | 4/2019 | Ye | H04L 1/0042 |
| 2020/0052809 A1* | 2/2020 | Hong | H04L 1/00 |

OTHER PUBLICATIONS

Hong, et al., Capacity-Achieving Rate-Compatible Polar Codes, 2016 IEEE International Symposium on Information Theory, p. 41-45, Jul. 10, 2016.

Mondelli, et al., Capacity-Achieving Rate-Compatible Polar Codes for General Channels, 2017 IEEE Wireless Communications and Networking Conference Workshops, p. 1-6, Mar. 19, 2017.

Arikan, Channel Polarization: A Method for Constructing Capacity—Achieving Codes for Symmetric Binary-Input Memoryless Channels, IEEE Transactions on Information Theory, vol. 55, No. 7, p. 3051-3073, Jul. 2009.

Tal, et al., List Decoding of Polar Codes, IEEE Transactions on Information Theory, vol. 61, No. 5, p. 2213-2226, May 2015.

Eslami, et al., On Finite-Length Performance of Polar Codes: Stopping Sets, Error Floor, and Concatenated Design, IEEE Transactions on Communications, vol. 61, No. 3, p. 919-929, Mar. 2013.

Zhang, et al., On the Puncturing Patterns for Punctured Polar Codes, 2014 IEEE International Symposium on Information Theory, p. 121-125, 2014.

Chen, et al., A Hybrid ARQ Scheme Based on Polar Codes, IEEE Communications Letters, vol. 17, No. 10, p. 1996-1999, Oct. 2013.

Wang, et al., A Novel Puncturing Scheme for Polar Codes, IEEE Communications Letters, vol. 18, No. 12, p. 2081-2084, Dec. 2014.

Miloslavskaya, Shortened Polar Codes, IEEE Transactions on Information Theory, vol. 61, No. 9, p. 4852-4865, Sep. 2015.

Korada, Polar Codes for Channel and Source Coding, These No. 4461 (2009), Jul. 15, 2009, pp. 1-169.

Hassani, et al., Universal Polar Codes, 2014 IEEE International Symposium on Information Theory, p. 1451-1455, 2014.

Arikan, et al., On the rate of channel polarization, ISIT 2009, Seoul, Korea, p. 1493-1495, Jun. 28-Jul. 3, 2009.

Hassani, et al., Finite-Length Scaling for Polar Codes, IEEE Transactions on Information Theory, vol. 60, No. 10, p. 5875-5898, Oct. 2014.

Mondelli, et al., Unified Scaling of Polar Codes: Error Exponent, Scaling Exponent, Moderate Deviations, and Error Floors, ISIT 2015, p. 1422-1426, 2015.

* cited by examiner

SYSTEMS AND METHODS FOR RATE-COMPATIBLE POLAR CODES FOR GENERAL CHANNELS

This application is a 371 of International Application No. PCT/IB2017/056876, filed Nov. 3, 2017, which claims the benefit of U.S. Application No. 62/416,949, filed Nov. 3, 2016, the disclosures of which are fully incorporated herein by reference.

PRIORITY

This application claims priority to U.S. Patent Provisional Application No. 62/416,949 filed on Nov. 3, 2016, entitled "RATE-COMPATIBLE POLAR CODES FOR GENERAL CHANNELS," the disclosure of which is hereby incorporated by reference.

TECHNICAL FIELD

The present disclosure relates, in general, to wireless communications and, more particularly, systems and methods for rate-compatible polar codes for general channels.

BACKGROUND

According to E. Arikan as published in "Channel Polarization: A method for constructing capacity-achieving codes for symmetric binary-input memoryless channels," IEEE Transactions on Information Theory, Vol. 55, No. 7 at pages 3051-3073, July 2009, Polar codes achieve the symmetric capacity of binary-input discrete memoryless (BMS) channels using a low-complexity successive cancellation (SC) decoder. The finite-length performance of polar codes can be improved by means of a list decoder enabling polar codes to approach the performance of optimal maximum-likelihood (ML) decoder as discussed by I. Tal and A. Vardy as published in "List decoding of polar codes" as published in IEEE Transactions on Information Theory, vol. 61, no. 5, pp. 2213-2226, May 2015.

Furthermore, a polar code concatenated with a simple CRC outperforms well-optimized LDPC and Turbo codes even for short block lengths. Due to their good performance and low complexity, polar codes are currently considered for possible use in future wireless communication systems such as, for example, 5G cellular systems.

Wireless broadband systems operate in the presence of time-varying channels and therefore require flexible and adaptive transmission techniques. For such systems, hybrid automatic repeat request based on incremental redundancy (HARQ-IR) schemes are often used, where parity bits are sent in an incremental fashion depending on the quality of the time-varying channel. In a HARQ-IR scheme, a number of parity bits chosen according to a rate requirement are sent by the transmitter. Incremental redundancy (IR) systems require the use of rate-compatible codes typically obtained by puncturing. For a code to be rate-compatible, the set of parity bits of a higher rate code should be a subset of the set of parity bits of a lower rate code. This allows the receiver that fails to decode at a particular rate, to request only additional parity bits from the transmitter. For this reason, there has been extensive research on the construction of rate-compatible Turbo codes and LDPC codes.

Although polar codes can achieve the capacity of any binary-input memoryless symmetric (BMS) channel, designing good rate-compatible constructions is more challenging. Puncturing of polar codes yields a rate loss, which means that the resulting scheme is not capacity-achieving. The following publications have discussed puncturing patterns that result in good performance:

A. Eslami and H. Pishro-Nik, "On finite-length performance of polar codes: Stopping sets, error floor, and concatenated design," in IEEE Transactions on Communications 2011, vol. 61, no. 3, pp. 919-929, March 2013.

L. Zhang, Z. Zhang, X. Wang, Q. Yu, and Y. Chen, "On the puncturing patterns for punctured polar codes," in Proc. IEEE Int. Symp. on Inf. Theory (ISIT), 2014, pp. 121-125.

K. Chen, K. Niu, and J. Lin, "A hybrid ARQ scheme based on polar codes," IEEE Communication Letters, vol. 17, no. 10, pp. 1996-1999, October 2013.

R. Wang and R. Liu, "A novel puncturing scheme for polar codes," IEEE Communication Letters, vol. 18, no. 12, pp. 2081-2084, December 2014.

D. -M. Shin, S. -C. Lim, and K. Yang, "Design of length-compatible polar codes based on the reduction of polarizing matrices," IEEE Transactions on Communications, vol. 61, no. 7, pp. 2593-2599, July 2013.

More recently, an efficient algorithm for joint optimization of puncturing patterns and the set of information bits of the code was proposed and shown to outperform LDPC codes was proposed by V. Miloslayskaya as published in "Shortened polar codes," IEEE Transactions on Information Theory, Vol. 61, No. 9, pages 4852-4865, September 2015. Because an information set is optimized according to a puncturing pattern, the above disclosed methods cannot be used to design a family of rate-compatible punctured codes as required for HARQ-IR, where the same information set (generally optimized for the mother code) should be used for all punctured codes in the family.

Capacity-achieving rate-compatible polar codes were recently proposed by S. -N. Hong, D. Hui and I. Maric as published in "Capacity-achieving rate-compatible polar codes," U.S. patent application Ser. No. 2017/0047947, also submitted to IEEE Transactions on Information Theory, January 2016. The key idea of the code construction exploits the nested property of polar codes. While this technique is optimal for HARQ-IR, it can only be used when the family of channels over which transmission takes place is ordered by degradation, otherwise the nested property does not hold. However, in some practical scenarios, this degradation condition is not satisfied. Such an example is where the transmitter and/or receiver have multiple antennas such as in a MIMO system. Then, the family of transmission channels is not degraded and, the methods discussed above cannot be used. Similarly, in the case in which there is non-Gaussian interference at the receiver, such as where another device is transmitting a modulated signal in the same radio resources, the family of channels is again non-degraded.

SUMMARY

To address the foregoing problems with existing solutions, disclosed is systems and methods using rate-compatible polar codes that are universal with respect to a family of transmission channels.

According to certain embodiments, a transmit node in a wireless communications system includes a first universal rate-compatible polar encoder and a transmitter. The first universal rate-compatible polar encoder is configured for a family of two or more types of channels and encodes a plurality of information bits to provide a plurality of coded bits. The transmitter transmits the plurality of coded bits to a receive node.

According to certain embodiments, a method by a transmit node is provided that includes encoding, by a first universal rate-compatible polar encoder configured for a family of two or more types of channels, a plurality of information bits to provide a plurality of coded bits. The plurality of coded bits are transmitted to a receive node.

According to certain embodiments, a receive node in a wireless communications system includes a receiver and a universal rate-compatible polar decoder. The receiver receives, from a transmit node, a first transmission comprising a first set of a plurality of rate-compatible coded bits. The universal rate-compatible polar decoder is configured for a family of two or more types of channels and decodes the first set of the plurality of rate-compatible coded bits.

According to certain embodiments, a method by a receive node is provided that includes receiving, from a transmit node, a first transmission comprising a first set of a plurality of rate-compatible coded bits. The first set of the plurality of rate-compatible coded bits is decoded by a universal rate-compatible polar decoder configured for a family of two or more types of channels.

Certain embodiments of the present disclosure may provide one or more technical advantages. For example, certain embodiments may provide a polar coding scheme that is both rate-compatible and universal with respect to a family of transmission channels. Accordingly, an advantage of certain embodiments may be that a different coding rate may be used to adapt to the time varying channel condition for any family of channels. Another advantage may be that polar coding scheme does not require that the family of transmission channels be ordered by degradation. Yet another advantage may be that the family of transmission channels may be of differing capacities and allow retransmissions. Still another advantage may be that certain embodiments result in the information sets associated with the polar-like codes being nested despite the fact that the family of transmission channels may be completely general and not necessarily ordered by degradation. According to certain embodiments, another advantage may be that the encoding and decoding can be used for hybrid automatic repeat request based on incremental redundancy (HARQ-IR).

Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION

According to certain embodiments, a polar coding scheme is constructed that is, at the same time, rate-compatible and universal with respect to a family of transmission channels without requiring that the family of transmission channels is ordered by degradation. Unlike previous polar coding schemes, the family of transmission channels may be of differing capacities and allow retransmissions. Rather, it is proposed herein that two modules be used: first, polar-like codes are constructed in such a way that the information sets associated with the polar-like codes are essentially nested despite the fact that the family of transmission channels is completely general and not necessarily ordered by degradation. Then, using these codes as component, a parallel concatenated polar (PCP) code is constructed. In a particular embodiment, the polar coding scheme may provide a family of rate-compatible codes as required for hybrid automatic repeat request based on incremental redundancy (HARQ-IR), in which parity bits are sent in an incremental fashion depending on the quality of the time-varying channel.

It is to be noted that any feature of any of the embodiments disclosed herein may be applied to any other embodiment, wherever appropriate. Likewise, any advantage of any of the embodiments may apply to the other embodiments, and vice versa. Other objectives, features and advantages of the enclosed embodiments will be apparent from the following description.

Generally, all terms used herein are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

Particular embodiments are described in FIGS. 1-10 of the drawings, like numerals being used for like and corresponding parts of the various drawings. Other embodiments, however, are contained within the scope of this disclosure and the invention should not be construed as limited to only the embodiments set forth herein; rather, these embodiments are provided by way of example to convey the scope of the inventive concept to those skilled in the art.

Figure 1:
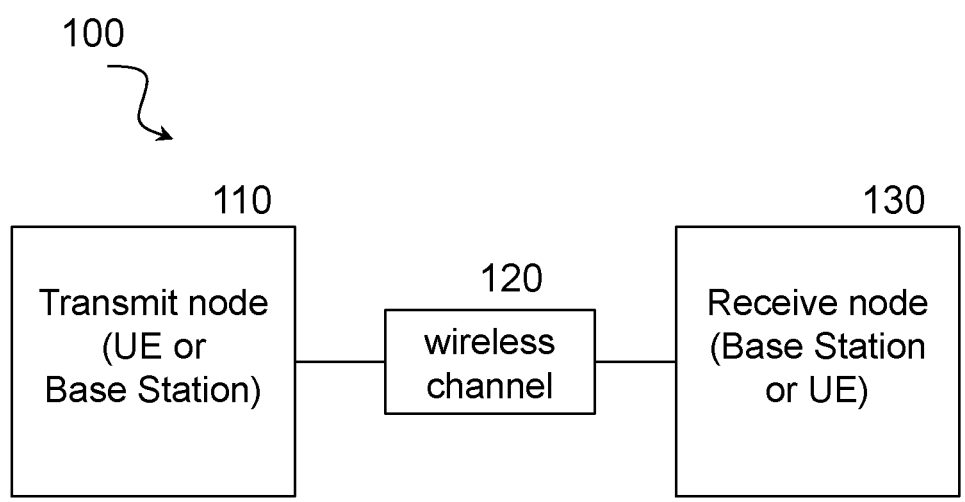
FIG. 1 illustrates an example communication system, according to certain embodiments.

FIG. 1 illustrates an example communication system 100, according to certain embodiments. The illustrated setting is a typical communications point-to-point communications system. As depicted, a transmit node 110 uses a wireless channel 120 to communicate with a receive node 130. Either one of transmit node 110 and receive node 110 may include a network node, which may be a base station in a particular embodiment, or a wireless device, which may include a user equipment (UE) in a particular embodiment.

Figure 2:
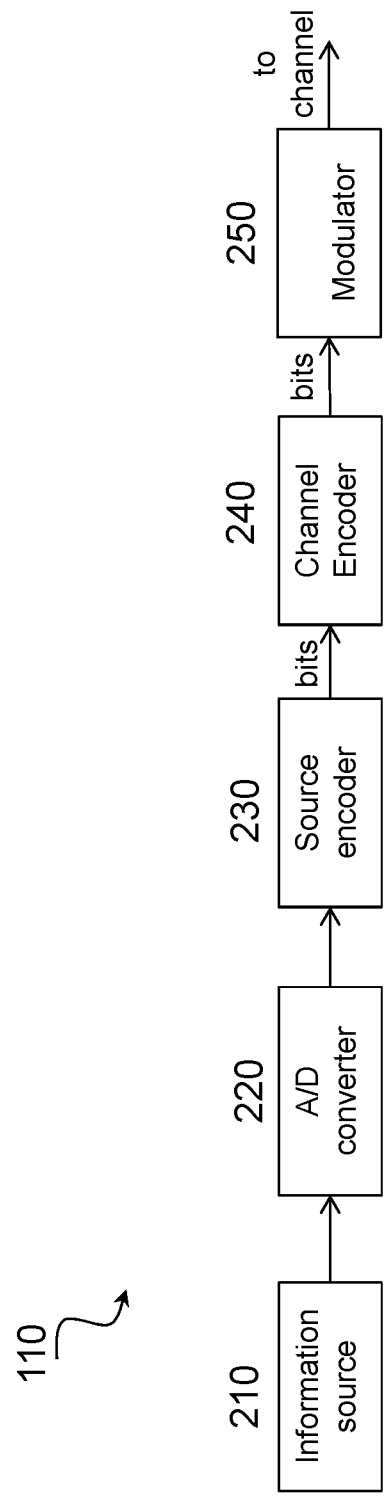
FIG. 2 illustrates an example transmit node, according to certain embodiments.

According to certain embodiments, the proposed polar coding scheme is a physical layer scheme that consists of an encoder and decoder, where the encoder is the part of the transmitter node and the decoder is a part of the receiver node. In a particular embodiment, the encoder and decoder may include a HARQ encoder and HARQ decoder, respectively. FIG. 2 illustrates an example transmit node 110. As depicted, transmit node 110 includes typical transmitter elements, including an information source 210, A/D converter 220, source encoder 230, channel encoder 240, and modulator 250. In a particular embodiment, the HARQ encoder may be part of the channel encoder block. Though the transmit node 110 is illustrated here, the receiver node may consist similarly of a demodulator, channel decoder, source decoder, D/A converter and an information sink. In a particular embodiment, the HARQ decoder may be a part of the channel decoder.

According to certain embodiments, the characteristics of wireless channel 120 in FIG. 1 may not be known at the transmit node 110. Instead, the transmit node 110, which may also be referred to as a transmitter, knows that wireless channel 120 belongs to a family of possible channels. The goal for the transmit node 110 is to adapt to the channel 120.

Assume $W_1, W_2, \ldots, W_K$ represents a family of K channels over which transmission takes place, where $[K]=\{1,2,\ldots,K\}$. It may be further assumed that $I(W_1)>I(W_2)>\ldots>I(W_K)$. Let k be the number of information bits to be transmitted and denote by $C(n,R,A)$ a polar code of block length n, rate R and information set A, where A represents the set of positions containing the information bits and $|A|=nR$.

According to certain embodiments, code construction consists in a universal module followed by a parallel-concatenation module. The universal module outputs the sequence of polar codes $\{C(n_i,R_j,A_j^{(i)})\}_{j \geq i, i \in [K]}$, which fulfils the following conditions for any $i \in [K]$:

(i) $R_i = \dfrac{k}{\sum\limits_{j=1}^{i} n_j}$;

(ii) $A_i^{(i)} \supseteq A_{i+1}^{(i)} \supseteq \ldots \supseteq A_K^{(i)}$;

(iii) $|A_j^{(i)}| = n_i R_j$ for any $j \geq i$.

This family of codes is passed as input to the parallel-concatenation module, which outputs the desired family of rate-compatible capacity-achieving codes. The conditions (i)-(ii)-(iii) and the design of the parallel-concatenation module are similar to previous polar coding techniques. However, according to previous techniques, the code $C(n_i, R_j, A_j^{(i)})$ is the standard polar code of block length $n_i$ designed for transmission over the channel $W_j$ and the property (ii) comes from the assumption that the family of channels $W_1, W_2, \ldots, W_K$ is ordered by degradation. According to certain embodiments, however, if the degradation assumption does not hold, then polar codes are not nested and property (ii) is violated. The goal of the universal module consists in suitably aligning the information sets in order to ensure property (ii).

Fix $i \in [K]$ and consider the construction of the codes $\{C(n_i, R_j, A_j^{(i)})\}_{j \geq i}$. These codes are required to be universal with respect to the transmission over $W_i, W_{i+1}, \ldots, W_K$, in the sense that the information sets for these channels are required to be nested, i.e., $A_i^{(i)} \supseteq A_{i+1}^{(i)} \supseteq \ldots \supseteq A_K^{(i)}$.

Consider the problem of building a polar code of block length n, which can be transmitted either over W or over W', where $I(W)>I(W')$. Let A and A' be the information sets which guarantee a reliable transmission over W and W', respectively. In a particular embodiment, the information sets may be represented as:

$$|A|=nI(W) \text{ and } |A'|=nI(W')$$

If $A \supseteq A'$, which is the case when W' is degraded with respect to W, then the indices of the information sets are already aligned and no further action is needed. However, in general, it may be the case that $A \not\supseteq A'$. If $A \supseteq A'$, which is the case when W' is degraded with respect to W, then the indices of the information sets are already aligned and no further action is needed. However, in general, it may be the case that $A \not\supseteq A'$. Similar to previous techniques, a family of channels with the same capacity was considered. The aim was to construct universal polar codes, which may also be referred to as channel codes that are reliable for every channel in the family. However, there was no consideration of the nested property in those previous techniques. According to certain embodiments, however, the setting is different and, thus, in this basic building block it is required that $I(W)>I(W')$. Thus, unlike in previous techniques, it must be ensured that the nested property (ii) is satisfied.

According to certain embodiments, $S=A'\setminus A$ and $S'$ is a subset of $A\setminus A'$ with the same cardinality of S. Note that such a subset $S'$ always exists, since $|A|>|A'|$. The indices may be ordered in these two sets so that $S=\{s_1, \ldots, s_{|S|}\}$ with $s_1 < \ldots < s_{|S|}$ and $S'=\{s'_1, \ldots, s'_{|S|}\}$ with $s'_1 < \ldots < s'_{|S|}$. Two copies of the original polar code of block length n are taken and one further step of polarization is performed as follows: for $j \in [S]$, the bit in position $s_j$ of the first copy is XORed with the bit in position $s'_j$ of the second copy and the remaining bits are left untouched. By polarizing position with position $s_j$ with position $s'_j$, a new pair of indices is obtained. One of the new pair of indices is bad such that it cannot be reliably decoded for either W or W'. The other is good such that it can be reliably decoded for both W and W'. After repeating this procedure a number of times (t times), a code of block length $n \cdot 2^t$ is obtained.

Figure 3:
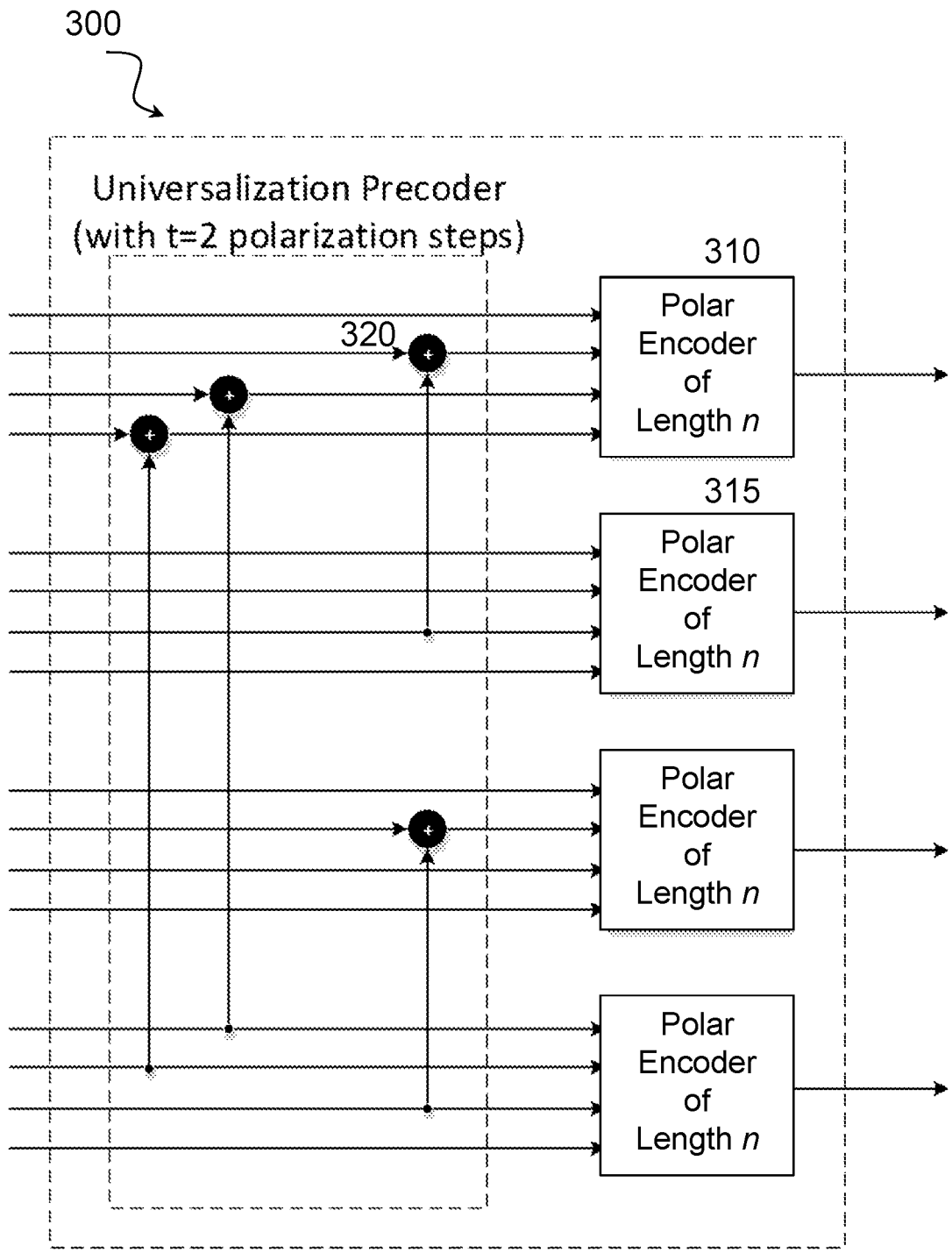
FIG. 3 illustrates an example encoder of Universal Polar code of length $2^t_n$, according to certain embodiments.

FIG. 3 illustrates an example encoder 300 of Universal Polar code of length $2^t n$, according to certain embodiments. As depicted, two copies of the original polar encoders of length n are taken by polar encoder 310 and polar encoder 315. One polarization step is performed by adder 320 to polarize position $s_j$ with position $s'_j$. Then, another polarization is performed using two copies of this configuration (i.e., the two original polar encoders of length n 310 and 315 plus the polarization step of adder 320), which contains four original polar encoders. Thus, FIG. 3 illustrates two additional steps of polarization performed for universalization purposes, according to certain embodiments. According to certain embodiments, only a fraction $2^{-t} \cdot |S|/n < 2^{-t}$ of the indices good for W' are simultaneously not good for W. If those indices are frozen, only a negligible rate loss is paid, and as a result, the indices of the information sets A and A' have been successfully aligned.

Returning to the original problem of building codes which are universal with respect to the family of channels $W_i$, $W_{i+1}, \ldots, W_K$ s.t. $I(W_i) > I(W_{i+1}) > \ldots > I(W_K)$, A and A' may be defined as the information sets for W and W', respectively. By performing the procedure described above, a code is constructed in which the indices good for $W_i$ and the indices good for $W_{i+1}$ are nested. Then, A and A' may be defined as the set of indices of this new code of blocklength $2^t n$ which are good for $W_{i+1}$ and $W_{i+2}$, respectively. By performing the procedure described above, we construct a code of blocklength $n2^{2t}$ in which the indices good for $W_i$, the indices good for $W_{i+1}$, and the indices good for $W_{i+2}$ are nested. By repeating this procedure for a total of K−i times, all the information sets are nested and, therefore, we are able to fulfil property (ii). The increase in the block length of the code is by a factor of $2^{(K-1)t}$ and the rate loss is upper bounded by $(K-1)2^{-t}$. Therefore, by choosing t large enough but finite, we have a negligible rate loss and an increase in the block length which is independent from the original length of the code.

The code construction described above yields codes with block lengths which are restricted to be powers of two, which comes from typical polar code construction. This fact produces a constraint in the capacities of $W_1, W_2, \ldots, W_K$ that can be supported with the above-described polar coding scheme. In order to remove such a constraint, puncturing may be used. Specifically, an assigned fraction of the code bits may not be transmitted (i.e., it is punctured) and the locations of the punctured positions may be shared between the transmitter and the receiver. A puncturing pattern may exist such that punctured polar codes achieve the capacity of any binary memoryless symmetric (BMS) channel. However, the knowledge of the locations of the punctured positions is typically not used in order to construct the code.

According to certain embodiments, however, the information relating to the location of the punctured positions is incorporated into the code construction. To do so, an arbitrary puncturing pattern is fixed. The Bhattacharyya parameters of the received bits may be considered. Specifically, the punctured bits have a Bhattacharyya parameter of 1, while the Bhattacharyya parameter of the remaining bits depends on the transmission channel. Thus, the Bhattacharyya parameters of the polarized channels may be estimated and, consequently, the positions with the highest reliability may be picked as an information set. In a particular embodiment, for example, the following procedure may be performed for the selection of the puncturing pattern: pick a puncturing pattern uniformly at random among all patterns of the required size and compute the reliability of the information set; if this reliability is good enough (i.e., it satisfies some pre-established performance goal), then stop; otherwise, repeat with different uniformly random puncturing patterns until the performance is good enough.

Similar to the code construction described above, the encoding also consists of two modules, according to certain embodiments. First, the component codes $\{C(n_i, R_j, A_j^{(i)})\}_{j \geq i, i \in [K]}$ are constructed. These codes may not be exactly standard polar codes because of the extra polarization steps introduced to ensure that the information sets are nested. During these extra polarization steps, the rule to combine the indices in the two copies of the original code is different from the standard construction of polar codes and is described in detail above. Then, these component codes are assembled into a parallel concatenated polar code.

According to certain embodiments, the decoding algorithm is similarly modified such that the component codes are no longer standard polar codes. This means that the combination rule for the extra polarization steps is different and, hence, the successive cancellation decoder described in previous polar coding techniques has to be modified accordingly. More specifically, given a code of blocklength n, the successive cancellation decoding algorithm consists in passing the n loglikelihood ratios obtained from the channel observations through log(n) layers, each composed of n positions. Then, the connections for the extra polarization steps are different from the connections of a standard polar code and they are given by the combination rule described above The performance of standard polar codes has been extensively studied for several regimes. For example, the error exponent regime, the error floor regime, and the scaling exponent regime were studied to determine whether the performance bounds for standard polar codes may be applied also to rate-compatible polar codes when the family of transmission channels is non-degraded.

The scaling laws of the overall rate-compatible code are driven by the worst component code, since the number of channels K remains finite as the number of information bits k and the block length n grow large. In particular, the block length of each component code is a fixed fraction of the entire block length of the rate-compatible code. In addition, the extra polarization steps introduced to ensure that the information sets are nested also produce a fixed increase in the block length. In other words, the overall increase in the block length does not depend on the length of the code and, hence, it can be thought of as a multiplicative constant. As a result, as concerns the error exponent regime, the error probability still scales as a function of the block length roughly as $2^{-\sqrt{n}}$. For the same reason, since standard polar codes are not affected by error floors, rate-compatible polar codes also do not have error floors. Unfortunately, the scaling exponent is affected by the extra polarization steps, since there is a trade-off between the increase in the block length by a factor $2^{(K-1)t}$ and the rate loss upper bounded by $(K-1)2^{-t}$. Thus, the bounds for the scaling exponent do not hold in this communication setting. In particular, $\mu$ is an upper bound on the scaling exponent of any BMS channel. For example, $\mu = 4.714$ may be the best known upper bound. Then, $\mu + K - 1$ is an upper bound on the scaling exponent for the rate-compatible polar code.

In order to prove this last claim, it may be recalled that, by definition of scaling exponent, the block length of a polar code with gap to capacity $\delta$ may be upper bounded by $1/\delta^\mu$. Furthermore, the blocklength of the rate compatible polar code may be increased by a multiplicative factor $2^{(K-1)t}$ and the gap to capacity may be increased by an additive factor $(K-1)2^{-t}$. By setting $(K-1)2^{-t} = \delta$, $2^{(K-1)t} = (K-1)^{K-1}/\delta^{K-1}$ may be obtained. Therefore, the block length of the rate compatible polar code is upper bounded by $(K-1)^{K-1}/\delta^{K+\mu-1}$. Since K is a constant, this suffices to prove that the scaling exponent is upper bounded by $+K-1$.

Embodiments disclosed herein enable an effective design of a sequence of channel codes of different rates based on a mother polar code. This allows a wireless communication system to use different coding rate to adapt to the time varying channel condition for any family of channels.

Figure 4:
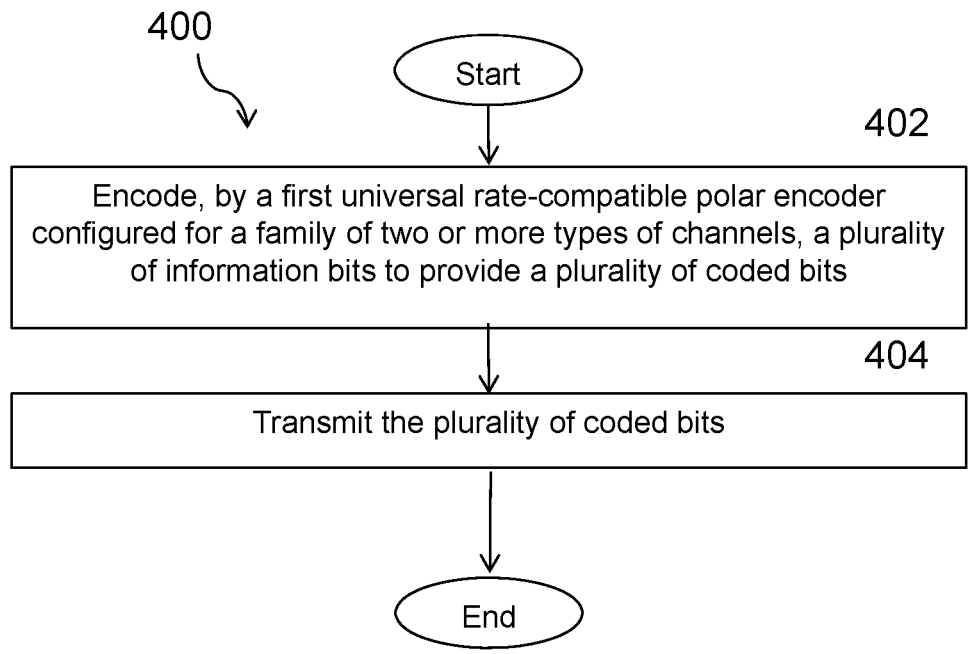
FIG. 4 illustrates an example method by an encoder using rate-compatible polar codes that are universal with respect to a family of transmission channels, according to certain embodiments.

FIG. 4 illustrates an example method 400 by a transmit node 110 using rate-compatible polar codes that are universal with respect to a family of transmission channels, according to certain embodiments. In a particular embodiment, the transmit node 110 may include a network node. In another embodiment, the transmit node 110 may include a wireless device.

At step 402, a first universal rate-compatible polar encoder, configured for a family of two or more types of channels, encodes a plurality of information bits to provide a plurality of coded bits. According to certain embodiments, the first universal rate-compatible polar encoder may include a first universalization precoder and one or more first polar encoders. The first universalization precoder may receive the plurality of information bits and perform a polarization step a number of times (t-times). The one or more first polar encoders may then receive the plurality of precoded bits from the universalization precoder and output a plurality of coded bits.

In a particular embodiment, the number of times (t-times) that the polarization step is performed is customized for a collection of two or more information sets. Each information set may correspond to a member in the family of two or more types of channel. Thus, a first information set may correspond to a first channel, and a second information set may correspond to a second channel. For example, in a particular embodiment, each of the one or more (t times) that the polarization step is performed may include XORing a bit located in a position indicated in the first information set corresponding to the first channel in the family of the two or more types of channels with another bit position indicated in the second information set corresponding to a second channel in the family of two or more types of channels.

In a particular embodiment, the first universal rate-compatible polar encoder may encode the plurality of information bits at a first code rate $r_1$ to provide a number $n_1$ of coded bits, where $n_1=k/r_1$ and k is the number of information bits in the plurality of information bits.

According to certain embodiments, encoding may further include encoding by a second universal rate-compatible polar encoder. In a particular embodiment, for example, a second universalization precoder may receive the plurality of information bits and perform the polarization step a number of times (t-times). Then one or more second polar encoders may encode a subset of the plurality of information bits at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$. The output of the first universal rate-compatible polar encoder and the output of a second universal rate-compatible polar encoder may be selectively concatenated to provide the plurality of coded bits at a desired code rate.

In a particular embodiment, the first universal rate-compatible polar encoder and the second universal rate-compatible polar encoder may each be operable to encode the plurality of information bits based on corresponding polar code generator matrices for rates $r_i$ and lengths $n_i$, where:
- i={1, . . . , T}, where T is a positive integer greater than or equal to 2;
- $n_1$ is a length for rate $r_1$ and, for all other values of i, $n_i$ is a number of additional coded bits to transform a code word for rate $r_{i-1}$ into a code word for rate $r_i$, i.e., $$n_i = \begin{cases} \frac{k}{r_i}, & \text{for } i = 1 \\ \frac{k}{r_i} - \sum_{j=1}^{i-1} n_j, & \text{for } i > 1 \end{cases}$$

where k is the number of information bits in the plurality of information bits;

$$\sum_{i=1}^{T} n_i = n,$$

where n is a maximum code word length of the plurality of coded bits (i.e., $n=k/n_T$); and
$r_i > r_{i+1}$ for i=1, . . . , T−1

The outputs of the plurality of polar encoders may be selectively concatenated to provide the plurality of coded bits at a desired code rate $r_{desired}$ such that, for the desired code rate $r_{desired}$, the plurality of coded bits is a concatenation of the outputs of the plurality of polar encoders (24, 28) for rates $r_1$, . . . , $r_{desired}$. In a particular embodiment, the polar code generator matrices for the plurality of polar encoders are submatrices $$G_{n_i}^{A_i}([1:r_i n_i])$$

of row-permuted generator matrices of i-th polar codes $$(G_{n_i}^{A_i})$$

consisting of a first row ($r_i$) through a second row ($r_i n_i$) of $$G_{n_i}^{A_i}.$$

According to certain embodiments, encoding may include encoding, by a first polar encoder of the one or more first polar encoders, the plurality of information bits at a first rate $r_1$ to provide $n_1$ coded bits and encoding, by one or more additional polar encoders of the one or more first polar encoders, a subset of the plurality of information bits consisting of a number $r_i n_i$ of the plurality of information bits at the rate $r_i$ to provide $n_i$ coded bits. In a particular embodiment, for each of the one or more additional polar encoders, the subset of the plurality of information bits encoded by the additional polar encoder is different than the subsets encoded by the other additional polar encoders. In another embodiment, for each of the one or more additional polar encoders, the subset of the plurality of information bits encoded by the additional polar encoder may include a predefined number of the plurality of information bits that are most unreliable with respect to transmission of the number $n_1$ of coded bits from the first polar encoder. In a particular embodiment, for at least one of the one or more additional polar encoders, an ordering of the subset of the plurality of information bits encoded by the at least one of the one or more additional polar encoders is different than an ordering of those same information bits when encoded by the first polar encoder.

At step 404, the transmit node 110 transmits the plurality of coded bits to a receive node 130. In a particular embodiment, the coded bits may be transmitted in step 404 at an initial code rate that is selected and used during the polar encoding of the plurality of information bits. If receive node 130 uses a CRC code embedded in the first set of the plurality of rate-compatible coded bits to determine that there is an error in the first transmission, transmit node 110 may receive negative acknowledgment (NACK) feedback from receive node 130, signaling the need for a retransmisison of the first transmission. If a maximum number of retransmissions has not been reached or met, a new code rate may be selected for an incremental redundancy retransmission. Thereafter, the transmit node may repeat step 402 to perform, via the first universal rate-compatible polar encoder, polar encoding of some of the plurality of coded bits to provide additional coded bits for the new code rate. Step 404 may be repeated and the additional coded bits may be transmitted. If an error is detected in the second transmission, a second NACK feedback may be received by the transmit node 110 to signal the need for a retransmisison of the second transmission. The process may repeat until the receive node 130 is able to decode the message based on all the coded bits from all the previous received transmissions with no detected error based on the CRC code or until a maximum number of retransmissions are reached. In the latter case, transmit node 110 will stop retransmitting the message and instead signal to the upper layers in the communication protocol that there is an error in transmitting the message.

Figure 5:
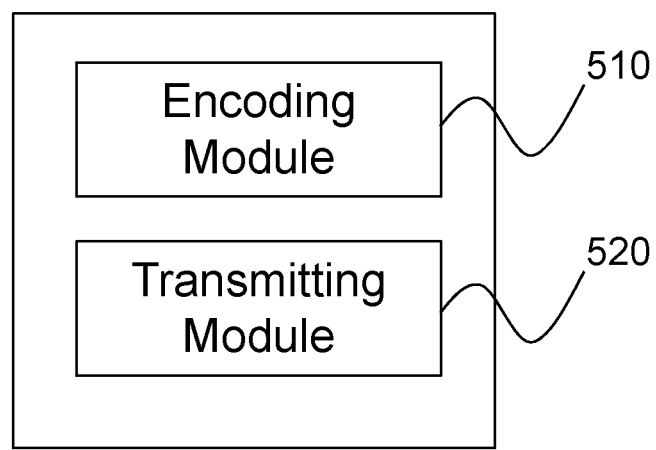
FIG. 5 illustrates an example virtual computing device for encoding using rate-compatible polar codes that are universal with respect to a family of transmission channels, according to certain embodiments.

In certain embodiments, the method for using rate-compatible polar codes that are universal with respect to a family of transmission channels as described above may be performed by a computer networking virtual apparatus. FIG. 5 illustrates an example virtual computing device 500 for using rate-compatible polar codes that are universal with respect to a family of transmission channels, according to certain embodiments. In certain embodiments, virtual computing device 500 may include modules for performing steps similar to those described above with regard to the method illustrated and described in FIG. 4. For example, virtual computing device 500 may include an encoding module 510, a transmitting module 520, and any other suitable modules for using rate-compatible polar codes that are universal with respect to a family of transmission channels. In some embodiments, one or more of the modules may be implemented by a transmit node 110, which may include a network node or a wireless device such as those described below with regard to FIGS. 8-10. In certain embodiments, the functions of two or more of the various modules may be combined into a single module.

The encoding module 510 may perform the encoding functions of virtual computing device 500. For example, in a particular embodiment, encoding module 510 may use a first universal rate-compatible polar encoder configured for a family of two or more types of channels to encode a plurality of information bits to provide a plurality of coded bits. In a particular embodiment, encoding module 510 may receive the plurality of information bits and perform a polarization step a number of times (t-times).

The transmitting module 520 may perform the transmitting functions of virtual computing device 500. For example, in a particular embodiment, transmitting module 520 may transmit the plurality of coded bits to a receive node.

Other embodiments of virtual computing device 500 may include additional components beyond those shown in FIG. 5 that may be responsible for providing certain aspects of the transmit node's functionality, including any of the functionality described above and/or any additional functionality (including any functionality necessary to support the solutions described above). The various different types of transmit nodes, which are described below, may include components having the same physical hardware but configured (e.g., via programming) to support different radio access technologies, or may represent partly or entirely different physical components.

Figure 6:
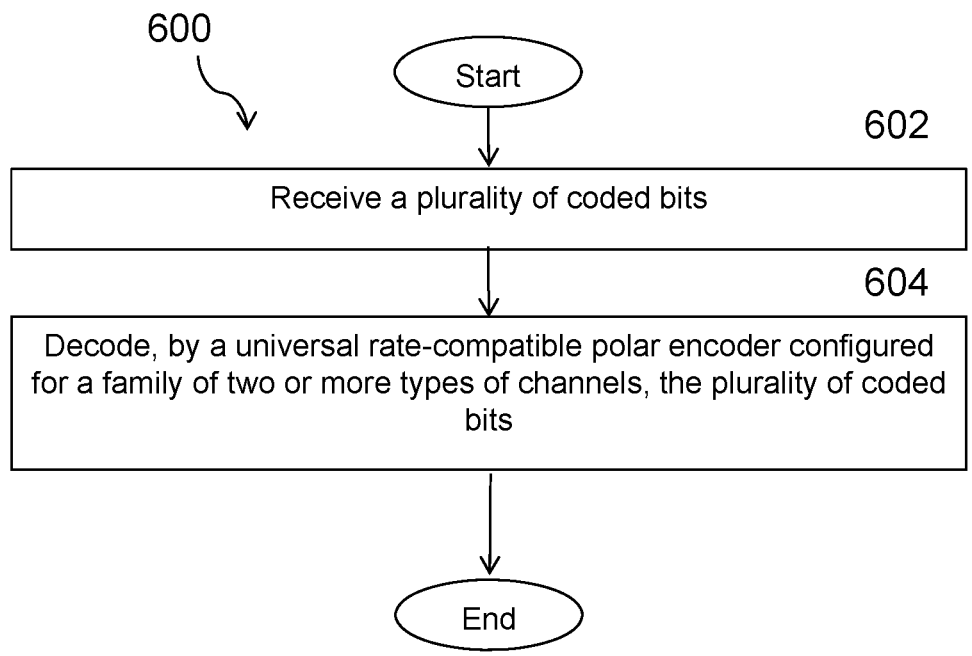
FIG. 6 illustrates an example method for decoding using rate-compatible polar codes that are universal with respect to a family of transmission channels, according to certain embodiments.

FIG. 6 illustrates an example method 600 by a receive node 130 for using rate-compatible polar codes that are universal with respect to a family of transmission channels, according to certain embodiments. In a particular embodiment, the receive node 130 may include a network node. In another embodiment, the receive node 130 may include a wireless device.

At step 602, receive node 130 receives, from a transmit node 110, a first transmission comprising a first set of a plurality of rate-compatible coded bits. According to certain embodiments, the first set of the plurality of rate-compatible coded bits were encoded by the transmit node 110 using the techniques described above. In a particular embodiment, the first set of the plurality of rate-compatible coded bits may be received at an initial code rate that was selected and used by the transmit node 110 during the polar encoding of the plurality of information bits.

At step 604, receive node 130 decodes, by a universal rate-compatible polar decoder configured for a family of two or more types of channels, the first set of the plurality of rate-compatible coded bits.

According to certain embodiments, receive node 130 may then use a CRC code embedded in the first set of the plurality of rate-compatible coded bits to determine if there is an error in the first transmission. If an error is detected in the first transmission, receive node 130 may transmit a first NACK feedback to the transmit node to signal the need for a retransmisison of the first transmission. If a maximum number of retransmissions has not been reached or met, receive node 130 may then receive from the transmit node 110 a second transmission comprising a second set of the plurality of rate-compatible coded bits. The second transmission may be may be received at a new code rate that was selected and used by the transmit node 110 during the polar encoding of the second set of the plurality of information bits. After decoding or attempted decoding, a CRC code embedded in the second set of the plurality of rate-compatible coded bits may again be used to determine if there is an error in the second transmission. If an error is detected in the second transmission, a second NACK feedback may be transmitted to the transmit node 110 to signal the need for a retransmisison of the second transmission. The process may repeat until the message is decoded based on all the coded bits from all the previous received transmissions with no detected error based on the CRC code or a maximum number of retransmissions are reached. In the latter case, transmit node 110 will stop retransmitting the message and instead signal to the upper layers in the communication protocol that there is an error in transmitting the message.

Figure 7:
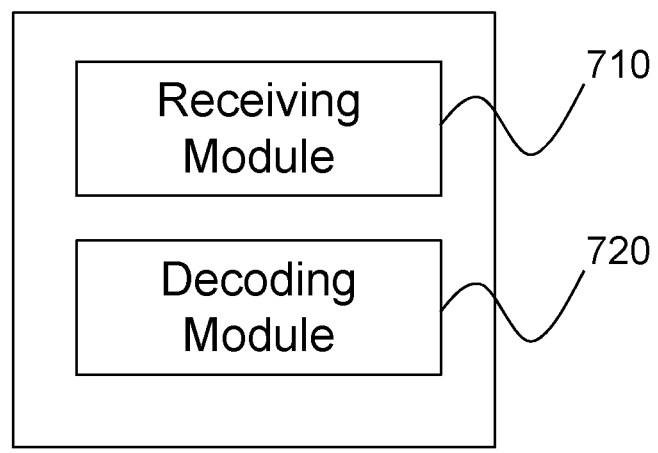
FIG. 7 illustrates an example virtual computing device for decoding using rate-compatible polar codes that are universal with respect to a family of transmission channels, in accordance with certain embodiments.

In certain embodiments, the method for receiving rate-compatible polar codes that are universal with respect to a family of transmission channels as described above may be performed by a computer networking virtual apparatus. FIG. 7 illustrates an example virtual computing device 700 for receiving rate-compatible polar codes that are universal with respect to a family of transmission channels, according to certain embodiments. In certain embodiments, virtual computing device 700 may include modules for performing steps similar to those described above with regard to the method illustrated and described in FIG. 6. For example, virtual computing device 700 may include a receiving module 710, a decoding module 720, and any other suitable modules for receiving rate-compatible polar codes that are universal with respect to a family of transmission channels. In some embodiments, one or more of the modules may be implemented by a receive node 130, which may include a network node or a wireless device such as those described below with regard to FIGS. 8-10. In certain embodiments, the functions of two or more of the various modules may be combined into a single module.

The receiving module 710 may perform the receiving functions of virtual computing device 700. For example, in a particular embodiment, receiving module 710 may receive, from a transmit node 110, a first transmission comprising a first set of a plurality of rate-compatible coded bits. According to certain embodiments, the first set of the plurality of rate-compatible coded bits were encoded by the transmit node 110 using the techniques described above.

The decoding module 720 may perform the decoding functions of virtual computing device 700. For example, in a particular embodiment, decoding module 720 may decode, by a universal rate-compatible polar decoder configured for a family of two or more types of channels, the first set of the plurality of rate-compatible coded bits.

Other embodiments of virtual computing device 700 may include additional components beyond those shown in FIG. 7 that may be responsible for providing certain aspects of the receive node's functionality, including any of the functionality described above and/or any additional functionality (including any functionality necessary to support the solutions described above). The various different types of receive nodes, which are described below, may include components having the same physical hardware but configured (e.g., via programming) to support different radio access technologies, or may represent partly or entirely different physical components.

Figure 8:
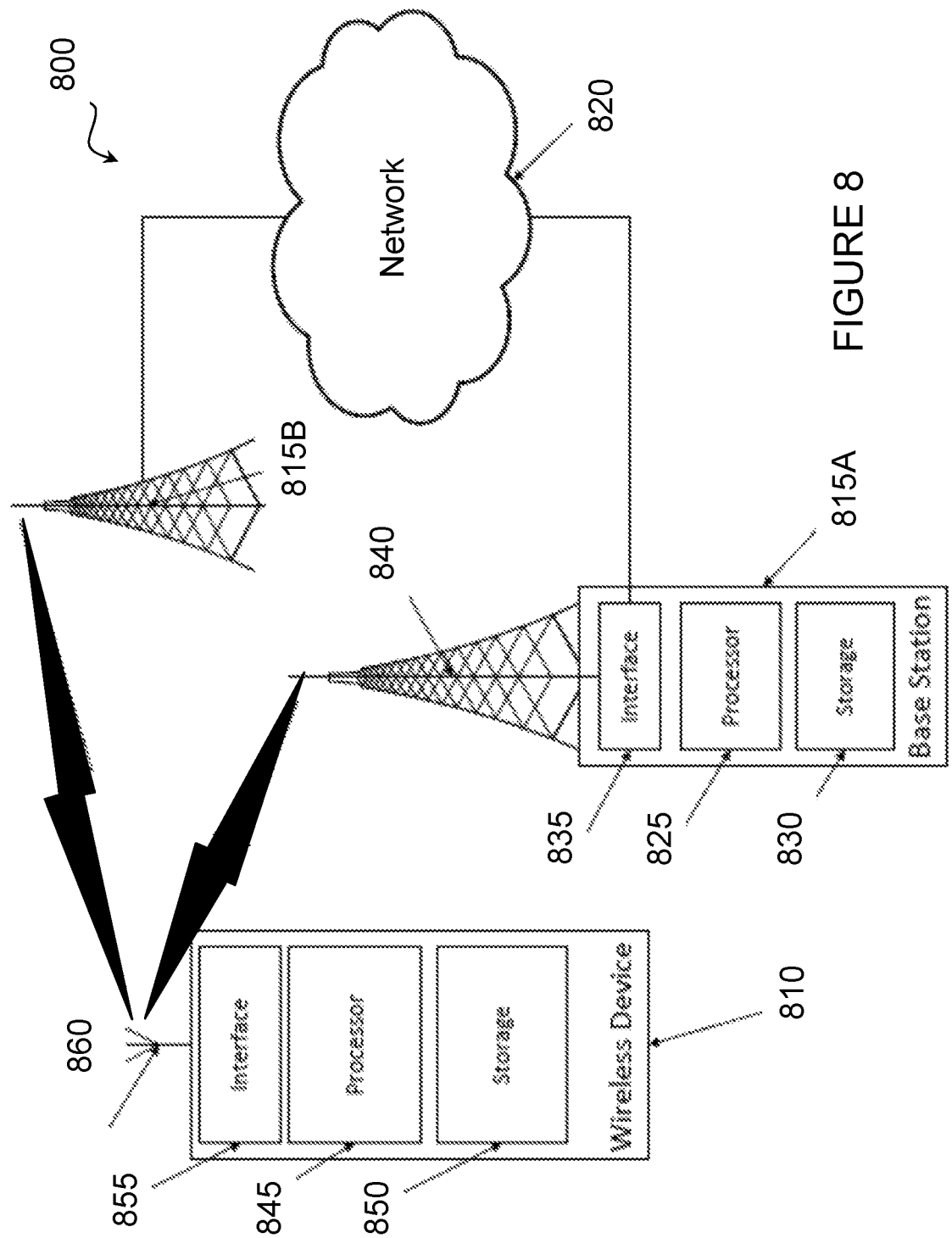
FIG. 8 illustrates an example wireless communication network using rate-compatible polar codes that are universal with respect to a family of transmission channels, according to certain embodiments.

Although the solutions described above may be implemented in any appropriate type of system using any suitable components, particular embodiments of the described solutions may be implemented in a wireless network, according to certain embodiments. FIG. 8 illustrates example wireless communication network 800 using rate-compatible polar codes that are universal with respect to a family of transmission channels. In the example embodiment of FIG. 8, the wireless communication network 800 provides communication and other types of services to one or more wireless devices 810. In the illustrated embodiment, the wireless communication network 800 includes one or more instances of network nodes 815 that facilitate the wireless devices' access to and/or use of the services provided by the wireless communication network 800. The wireless communication network 800 may further include any additional elements suitable to support communication between wireless devices 810 or between a wireless device 810 and another communication device, such as a landline telephone.

Network 820 may comprise one or more IP networks, public switched telephone networks (PSTNs), packet data networks, optical networks, wide area networks (WANs), local area networks (LANs), wireless local area networks (WLANs), wired networks, wireless networks, metropolitan area networks, and other networks to enable communication between devices.

The wireless communication network may represent any type of communication, telecommunication, data, cellular, and/or radio network or other type of system. In particular embodiments, the wireless communication network may be configured to operate according to specific standards or other types of predefined rules or procedures. Thus, particular embodiments of the wireless communication network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, and/or ZigBee standards.

FIG. 8 illustrates a wireless network comprising a more detailed view of network node 815 and wireless device 810, in accordance with a particular embodiment. Specifically, network node 815 is depicted as including processor 825, storage 830, interface 865, and antenna 840. Similarly, wireless device 810 is depicted as including processor 845, storage 850, interface 855 and antenna 860. These and other components may work together in order to provide network node 815 and/or wireless device 810 functionality, such as providing wireless connections in a wireless communication network 800. For simplicity, FIG. 8 only depicts network 820, network nodes 815 and 815a, and WD 810. However, in other embodiments, wireless communication network 800 may comprise any number of wired or wireless networks, network nodes, base stations, controllers, wireless devices, relay stations, and/or any other components that may facilitate or participate in the communication of data and/or signals whether via wired or wireless connections.

As used herein, "network node" refers to equipment capable, configured, arranged and/or operable to communicate directly or indirectly with a wireless device and/or with other equipment in the wireless communication network that enable and/or provide wireless access to the wireless device. Examples of network nodes include, but are not limited to, access points (APs), in particular radio access points. A network node may represent base stations (BSs), such as radio base stations. Particular examples of radio base stations include Node Bs, and evolved Node Bs (eNBs). Base stations may be categorized based on the amount of coverage they provide (or, stated differently, their transmit power level) and may then also be referred to as femto base stations, pico base stations, micro base stations, or macro base stations. "Network node" also includes one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base stations may also be referred to as nodes in a distributed antenna system (DAS).

As a particular non-limiting example, a base station may be a relay node or a relay donor node controlling a relay.

Yet further examples of network nodes include multi-standard radio (MSR) radio equipment such as MSR BSs, network controllers such as radio network controllers (RNCs) or base station controllers (BSCs), base transceiver stations (BTSs), transmission points, transmission nodes, Multi-cell/multicast Coordination Entities (MCEs), core network nodes (e.g., MSCs, MMEs), O&M nodes, OSS nodes, SON nodes, positioning nodes (e.g., E-SMLCs), and/or MDTs. More generally, however, network nodes may represent any suitable device (or group of devices) capable, configured, arranged, and/or operable to enable and/or provide a wireless device access to the wireless communication network or to provide some service to a wireless device that has accessed the wireless communication network.

As used herein, the term "radio node" is used generically to refer both to wireless devices and network nodes, as each is respectively described above.

As described above, network node 815 is depicted as including processor 825, storage 830, interface 835, and antenna 840. These components are depicted as single boxes located within a single larger box. In practice however, a network node may comprise multiple different physical components that make up a single illustrated component (e.g., interface 835 may comprise terminals for coupling wires for a wired connection and a radio transceiver for a wireless connection). As another example, network node 815 may be a virtual network node in which multiple different physically separate components interact to provide the functionality of network node 815 (e.g., processor 825 may comprise three separate processors located in three separate enclosures, where each processor is responsible for a different function for a particular instance of network node 815). In still other embodiments, network node 815 may be composed of multiple physically separate components (e.g., a NodeB component and a RNC component, a BTS component and a BSC component, etc.), which may each have their own respective processor, storage, and interface components. In certain scenarios in which network node 815 comprises multiple separate components (e.g., BTS and BSC components), one or more of the separate components may be shared among several network nodes. For example, a single RNC may control multiple NodeB's. In such a scenario, each unique NodeB and BSC pair, may be a separate network node. In some embodiments, network node 815 may be configured to support multiple radio access technologies (RATs). In such embodiments, some components may be duplicated (e.g., separate storage 830 for the different RATs) and some components may be reused (e.g., the same antenna 840 may be shared by the RATs).

Processor 825 may be a combination of one or more of a microprocessor, controller, microcontroller, central processing unit, digital signal processor, application specific integrated circuit, field programmable gate array, or any other suitable computing device, resource, or combination of hardware, software and/or encoded logic operable to provide, either alone or in conjunction with other network node components, such as storage 825, network node 815 functionality. For example, processor 825 may execute instructions stored in storage 830. Such functionality may include providing various wireless features discussed herein to a wireless device, such as wireless device 810, including any of the features or benefits disclosed herein.

Storage 830 may comprise any form of volatile or non-volatile computer readable memory including, without limitation, persistent storage, solid state memory, remotely mounted memory, magnetic media, optical media, random access memory (RAM), read-only memory (ROM), removable media, or any other suitable local or remote memory component. Storage 830 may store any suitable instructions, data or information, including software and encoded logic, utilized by network node 815. Storage 830 may be used to store any calculations made by processor 825 and/or any data received via interface 835.

Network node 815 also comprises interface 835 which may be used in the wired or wireless communication of signalling and/or data between network node 815, network 820, and/or wireless device 810. For example, interface 835 may perform any formatting, coding, or translating that may be needed to allow network node 815 to send and receive data from network 820 over a wired connection. Interface 835 may also include a radio transmitter and/or receiver that may be coupled to or a part of antenna 840. The radio may receive digital data that is to be sent out to other network nodes or wireless devices via a wireless connection. The radio may convert the digital data into a radio signal having the appropriate channel and bandwidth parameters. The radio signal may then be transmitted via antenna 840 to the appropriate recipient, which may include wireless device 810, in a particular embodiment.

Antenna 840 may be any type of antenna capable of transmitting and receiving data and/or signals wirelessly. In some embodiments, antenna 840 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line.

As used herein, "wireless device" refers to a device capable, configured, arranged and/or operable to communicate wirelessly with network nodes and/or another wireless device. Communicating wirelessly may involve transmitting and/or receiving wireless signals using electromagnetic signals, radio waves, infrared signals, and/or other types of signals suitable for conveying information through air. In particular embodiments, wireless devices may be configured to transmit and/or receive information without direct human interaction. For instance, a wireless device may be designed to transmit information to a network on a predetermined schedule, when triggered by an internal or external event, or in response to requests from the network. Generally, a wireless device may represent any device capable of, configured for, arranged for, and/or operable for wireless communication, for example radio communication devices. Examples of wireless devices include, but are not limited to, user equipment (UE) such as smart phones. Further examples include wireless cameras, wireless-enabled tablet computers, laptop-embedded equipment (LEE), laptop-mounted equipment (LME), USB dongles, and/or wireless customer-premises equipment (CPE).

As one specific example, a wireless device may represent a user equipment (UE) configured for communication in accordance with one or more communication standards promulgated by the $3^{rd}$ Generation Partnership Project (3GPP), such as 3GPP's GSM, UMTS, LTE, and/or 5G standards. As used herein, a UE may not necessarily have a "user" in the sense of a human user who owns and/or operates the relevant device. Instead, a UE may represent a device that is intended for sale to, or operation by, a human user but that may not initially be associated with a specific human user.

The wireless device may support device-to-device (D2D) communication, for example by implementing a 3GPP standard for sidelink communication, and may in this case be referred to as a D2D communication device.

As yet another specific example, in an Internet of Things (IoT) scenario, a wireless device may represent a machine or other device that performs monitoring and/or measurements, and transmits the results of such monitoring and/or measurements to another wireless device and/or a network node. The wireless device may in this case be a machine-to-machine (M2M) device, which may in a 3GPP context be referred to as a machine-type communication (MTC) device. As one particular example, the wireless device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a wireless device may represent a vehicle or other equipment that is capable of monitoring and/or reporting on its operational status or other functions associated with its operation.

A wireless device as described above may represent the endpoint of a wireless connection, in which case the device may be referred to as a wireless terminal. Furthermore, a wireless device as described above may be mobile, in which case it may also be referred to as a mobile device or a mobile terminal.

As depicted in FIG. 8, wireless device 810 may be any type of wireless endpoint, mobile station, mobile phone, wireless local loop phone, smartphone, user equipment, desktop computer, PDA, cell phone, tablet, laptop, VoIP phone or handset, which is able to wirelessly send and receive data and/or signals to and from a network node, such as network node 815 and/or other wireless devices. Wireless device 810 comprises processor 845, storage 850, interface 855, and antenna 860. Like network node 815, the components of wireless device 810 are depicted as single boxes located within a single larger box, however in practice a wireless device may comprises multiple different physical components that make up a single illustrated component (e.g., storage 850 may comprise multiple discrete microchips, each microchip representing a portion of the total storage capacity).

Processor 845 may be a combination of one or more of a microprocessor, controller, microcontroller, central processing unit, digital signal processor, application specific integrated circuit, field programmable gate array, or any other suitable computing device, processing circuitry, resource, or combination of hardware, software and/or encoded logic operable to provide, either alone or in combination with other wireless device 810 components, such as storage 850, wireless device 810 functionality. Such functionality may include providing various wireless features discussed herein, including any of the features or benefits disclosed herein.

Storage 850 may be any form of volatile or non-volatile memory including, without limitation, persistent storage, solid state memory, remotely mounted memory, magnetic media, optical media, random access memory (RAM), read-only memory (ROM), removable media, or any other suitable local or remote memory component. Storage 850 may store any suitable data, instructions, or information, including software and encoded logic, utilized by wireless device 810. Storage 850 may be used to store any calculations made by processor 845 and/or any data received via interface 855.

Interface 855 may be used in the wireless communication of signalling and/or data between wireless device 810 and network node 815. For example, interface 855 may perform any formatting, coding, or translating that may be needed to allow wireless device 810 to send and receive data from network node 200 over a wireless connection. Interface 855 may also include a radio transmitter and/or receiver that may be coupled to or a part of antenna 860. The radio may receive digital data that is to be sent out to network node 815 via a wireless connection. The radio may convert the digital data into a radio signal having the appropriate channel and bandwidth parameters. The radio signal may then be transmitted via antenna 860 to network node 815.

Antenna 860 may be any type of antenna capable of transmitting and receiving data and/or signals wirelessly. In some embodiments, antenna 860 may comprise one or more omni-directional, sector or panel antennas operable to transmit/receive radio signals between 2 GHz and 66 GHz. For simplicity, antenna 860 may be considered a part of interface 855 to the extent that a wireless signal is being used.

According to certain embodiments, either or both of network node 815 and wireless device 810 may be a transmit node, such as transmit node 110 depicted in FIG. 1. Accordingly, in particular embodiments, network node 815 and/or wireless device 810 may perform any of the operations described herein for encoding using rate-compatible polar codes that are universal with respect to a family of transmission channels. For example, network node 815 and/or wireless device 810 may include modules such as those described above with regard to FIG. 5 for performing functions for encoding using rate-compatible polar codes that are universal with respect to a family of transmission channels, according to certain embodiments.

Likewise, according to certain embodiments, according to certain embodiments, either or both of network node 815 and wireless device 810 may be a receive node, such as receive node 130 depicted in FIG. 1. Accordingly, in particular embodiments, network node 815 and/or wireless device 810 may perform any of the operations described herein for decoding using rate-compatible polar codes that are universal with respect to a family of transmission channels. For example, network node 815 and/or wireless device 810 may include modules such as those described above with regard to FIG. 7 for performing functions for decoding using rate-compatible polar codes that are universal with respect to a family of transmission channels, according to certain embodiments.

Figure 9:
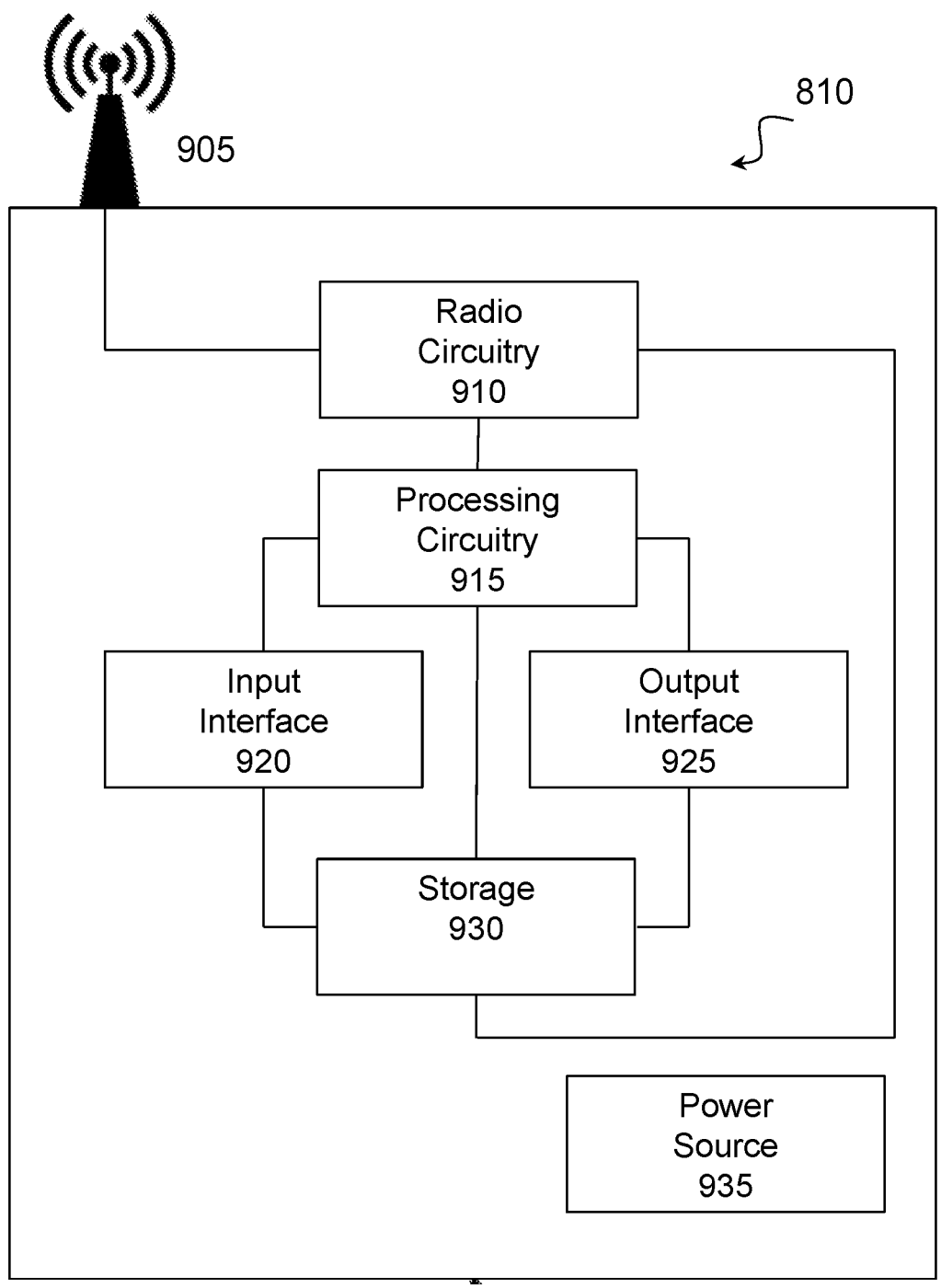
FIG. 9 illustrate an example wireless device using rate-compatible polar codes that are universal with respect to a family of transmission channels, according to certain embodiments.

FIG. 9 illustrate an example wireless device 810 using rate-compatible polar codes that are universal with respect to a family of transmission channels, according to certain embodiments. As shown in FIG. 9, wireless device 810 is an example wireless device that may include a UE, according to certain embodiments. Wireless device 810 includes an antenna 905, radio front-end circuitry 910, processing circuitry 915, and a computer-readable storage medium 930. Antenna 905 may include one or more antennas or antenna arrays, and is configured to send and/or receive wireless signals, and is connected to radio front-end circuitry 910. In certain alternative embodiments, wireless device 810 may not include antenna 905, and antenna 905 may instead be separate from wireless device 810 and be connectable to wireless device 810 through an interface or port.

The radio front-end circuitry 910 may comprise various filters and amplifiers, is connected to antenna 905 and processing circuitry 915, and is configured to condition signals communicated between antenna 905 and processing circuitry 915. In certain alternative embodiments, wireless device 810 may not include radio front-end circuitry 910, and processing circuitry 915 may instead be connected to antenna 905 without radio front-end circuitry 910.

Processing circuitry 915 may include one or more of radio frequency (RF) transceiver circuitry, baseband processing circuitry, and application processing circuitry. In some embodiments, the RF transceiver circuitry, baseband processing circuitry, and application processing circuitry may be on separate chipsets. In alternative embodiments, part or all of the baseband processing circuitry and application processing circuitry may be combined into one chipset, and the RF transceiver circuitry may be on a separate chipset. In still alternative embodiments, part or all of the RF transceiver circuitry and baseband processing circuitry may be on the same chipset, and the application processing circuitry may be on a separate chipset. In yet other alternative embodiments, part or all of the RF transceiver circuitry, baseband processing circuitry, and application processing circuitry may be combined in the same chipset. Processing circuitry 915 may include, for example, one or more central processing units (CPUs), one or more microprocessors, one or more application specific integrated circuits (ASICs), and/or one or more field programmable gate arrays (FPGAs).

In particular embodiments, some or all of the functionality described herein as being provided by a wireless device may be provided by the processing circuitry 915 executing instructions stored on a computer-readable storage medium 930. In alternative embodiments, some or all of the functionality may be provided by the processing circuitry 915 without executing instructions stored on a computer-readable medium, such as in a hard-wired manner. In any of those particular embodiments, whether executing instructions stored on a computer-readable storage medium or not, the processing circuitry can be said to be configured to perform the described functionality. The benefits provided by such functionality are not limited to the processing circuitry 915 alone or to other components of wireless device 810, but are enjoyed by the wireless device as a whole, and/or by end users and the wireless network generally.

Antenna 905, radio front-end circuitry 910, and/or processing circuitry 915 may be configured to perform any receiving operations described herein as being performed by a wireless device. Any information, data and/or signals may be received from a network node and/or another wireless device.

The processing circuitry 915 may be configured to perform any determining operations described herein as being performed by a wireless device. Determining as performed by processing circuitry 915 may include processing information obtained by the processing circuitry 915 by, for example, converting the obtained information into other information, comparing the obtained information or converted information to information stored in the wireless device, and/or performing one or more operations based on the obtained information or converted information, and as a result of said processing making a determination.

Antenna 905, radio front-end circuitry 910, and/or processing circuitry 915 may be configured to perform any transmitting operations described herein as being performed by a wireless device. Any information, data and/or signals may be transmitted to a network node and/or another wireless device.

Computer-readable storage medium 930 is generally operable to store instructions, such as a computer program, software, an application including one or more of logic, rules, code, tables, etc. and/or other instructions capable of being executed by a processor. Examples of computer-readable storage medium 930 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or any other volatile or non-volatile, non-transitory computer-readable and/or computer-executable memory devices that store information, data, and/or instructions that may be used by processing circuitry 915. In some embodiments, processing circuitry 915 and computer-readable storage medium 930 may be considered to be integrated.

Alternative embodiments of wireless device 810 may include additional components beyond those shown in FIG. 9 that may be responsible for providing certain aspects of the wireless device's functionality, including any of the functionality described herein and/or any functionality necessary to support the solution described above. As just one example, wireless device 810 may include input interfaces, devices and circuits, and output interfaces, devices and circuits. Input interfaces, devices, and circuits are configured to allow input of information into wireless device 810, and are connected to processing circuitry 915 to allow processing circuitry 915 to process the input information. For example, input interfaces, devices, and circuits may include a microphone, a proximity or other sensor, keys/buttons, a touch display, one or more cameras, a USB port, or other input elements. Output interfaces, devices, and circuits are configured to allow output of information from wireless device 810, and are connected to processing circuitry 915 to allow processing circuitry 915 to output information from wireless device 810. For example, output interfaces, devices, or circuits may include a speaker, a display, vibrating circuitry, a USB port, a headphone interface, or other output elements. Using one or more input and output interfaces, devices, and circuits, wireless device 810 may communicate with end users and/or the wireless network, and allow them to benefit from the functionality described herein.

As another example, wireless device 810 may include power source 935. Power source 935 may comprise power management circuitry. Power source 935 may receive power from a power supply, which may either be comprised in, or be external to, power source 935. For example, wireless device 810 may comprise a power supply in the form of a battery or battery pack which is connected to, or integrated in, power source 935. Other types of power sources, such as photovoltaic devices, may also be used. As a further example, wireless device 810 may be connectable to an external power supply (such as an electricity outlet) via an input circuitry or interface such as an electrical cable, whereby the external power supply supplies power to power source 935. Power source 935 may be connected to radio front-end circuitry 910, processing circuitry 915, and/or computer-readable storage medium 930 and be configured to supply wireless device 810, including processing circuitry 915, with power for performing the functionality described herein.

Wireless device 810 may also include multiple sets of processing circuitry 915, computer-readable storage medium 930, radio circuitry 910, and/or antenna 905 for different wireless technologies integrated into wireless device 810, such as, for example, GSM, WCDMA, LTE, NR, Wi-Fi, or Bluetooth wireless technologies. These wireless technologies may be integrated into the same or different chipsets and other components within wireless device 810.

Figure 10:
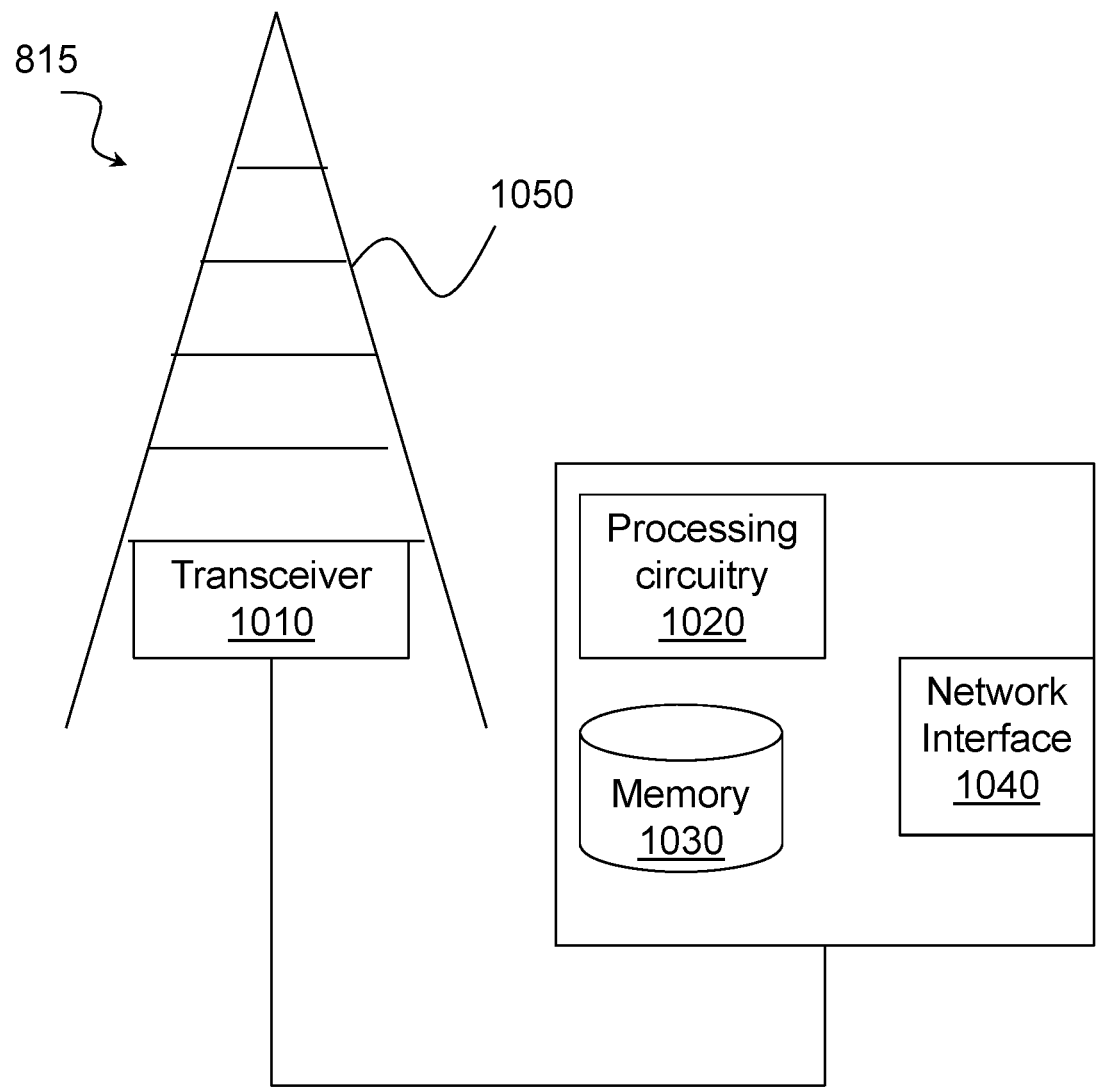
FIG. 10 illustrates an example network node using rate-compatible polar codes that are universal with respect to a family of transmission channels, according to certain embodiments

FIG. 10 illustrate an example network node 815 for using rate-compatible polar codes that are universal with respect to a family of transmission channels, according to certain embodiments, according to certain embodiments. As described above, network node 815 may be any type of radio network node or any network node that communicates with a wireless device and/or with another network node. Examples of a network node 815 are provided above.

Network nodes 815 may be deployed throughout network as a homogenous deployment, heterogeneous deployment, or mixed deployment. A homogeneous deployment may generally describe a deployment made up of the same (or similar) type of network nodes 815 and/or similar coverage and cell sizes and inter-site distances. A heterogeneous deployment may generally describe deployments using a variety of types of network nodes 815 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 815 may include one or more of transceiver 1010, processor 1020, memory 1030, and network interface 1040. In some embodiments, transceiver 1010 facilitates transmitting wireless signals to and receiving wireless signals from wireless device 810 (e.g., via an antenna), processor 1020 executes instructions to provide some or all of the functionality described above as being provided by a network node 815, memory 1030 stores the instructions executed by processor 1020, and network interface 1040 communicates signals to backend network components, such as a gateway, switch, router, Internet, Public Switched Telephone Network (PSTN), core network nodes or radio network controllers, etc.

In certain embodiments, network node 815 may be capable of using multi-antenna techniques, and may be equipped with multiple antennas and capable of supporting MIMO techniques. The one or more antennas may have controllable polarization. In other words, each element may have two co-located sub elements with different polarizations (e.g., 90 degree separation as in cross-polarization), so that different sets of beamforming weights will give the emitted wave different polarization.

Processor 1020 may include any suitable combination of hardware and software implemented in one or more modules to execute instructions and manipulate data to perform some or all of the described functions of network node 815. In some embodiments, processor 1020 may include, for example, one or more computers, one or more central processing units (CPUs), one or more microprocessors, one or more applications, and/or other logic.

Memory 1030 is generally operable to store instructions, such as a computer program, software, an application including one or more of logic, rules, algorithms, code, tables, etc. and/or other instructions capable of being executed by a processor. Examples of memory 1030 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1040 is communicatively coupled to processor 1020 and may refer to any suitable device operable to receive input for network node 815, send output from network node 815, perform suitable processing of the input or output or both, communicate to other devices, or any combination of the preceding. Network interface 1040 may include appropriate hardware (e.g., port, modem, network interface card, etc.) and software, including protocol conversion and data processing capabilities, to communicate through a network.

Other embodiments of network node 815 may include additional components beyond those shown in FIG. 10 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components. Additionally, the terms first and second are provided for example purposes only and may be interchanged.

Any steps or features described herein are merely illustrative of certain embodiments. It is not required that all embodiments incorporate all the steps or features disclosed nor that the steps be performed in the exact order depicted or described herein. Furthermore, some embodiments may include steps or features not illustrated or described herein, including steps inherent to one or more of the steps disclosed herein.

Any appropriate steps, methods, or functions may be performed through a computer program product that may, for example, be executed by the components and equipment illustrated in one or more of the figures above. For example, storage 203 may comprise computer readable means on which a computer program can be stored. The computer program may include instructions which cause processor 202 (and any operatively coupled entities and devices, such as interface 201 and storage 203) to execute methods according to embodiments described herein. The computer program and/or computer program product may thus provide means for performing any steps herein disclosed.

Any appropriate steps, methods, or functions may be performed through one or more functional modules. Each functional module may comprise software, computer programs, sub-routines, libraries, source code, or any other form of executable instructions that are executed by, for example, a processor. In some embodiments, each functional module may be implemented in hardware and/or in software. For example, one or more or all functional modules may be implemented by processors 825 and/or 845, possibly in cooperation with storage 830 and/or 850. As another example, one or more or all functional modules may be implemented by processing circuitry 915 and/or 1020, possibly in cooperation with storage 930 and/or 1030. Thus, any combination of the processors and/or processing circuitry and/or storage may thus be arranged to allow processors and/or processing circuitry to fetch instructions from the storage and execute the fetched instructions to allow the respective functional module to perform any steps or functions disclosed herein.

Certain aspects of the inventive concept have mainly been described above with reference to a few embodiments. However, as is readily appreciated by a person skilled in the art, embodiments other than the ones disclosed above are equally possible and within the scope of the inventive concept. Similarly, while a number of different combinations have been discussed, all possible combinations have not been disclosed. One skilled in the art would appreciate that other combinations exist and are within the scope of the inventive concept. Moreover, as is understood by the skilled person, the herein disclosed embodiments are as such applicable also to other standards and communication systems and any feature from a particular figure disclosed in connection with other features may be applicable to any other figure and or combined with different features.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

The invention claimed is:

1. A transmit node in a wireless communications system, comprising: a first universal rate-compatible polar encoder configured for a family of two or more types of channels, the universal rate-compatible polar encoder operable to encode a plurality of information bits to provide a plurality of coded bits, and wherein the first universal rate-compatible polar encoder comprises:
 a first universalization precoder operable to receive the plurality of information bits and perform a polarization step a number of times (t-times); and
 one or more first polar encoders configured to receive a plurality of precoded bits from the universalization precoder and output a plurality of coded bits; and a transmitter operable to transmit the plurality of coded bits to a receive node.

2. The transmit node of claim 1, wherein the number of times (t-times) that each polarization step is customized for a collection of two or more information sets, each information set corresponding to a member in the family of two or more types of channel.

3. The transmit node of claim 2, wherein each of the one or more (t-times) that the polarization step is performed comprises XORing a bit located in a position indicated in a first information set corresponding to a first channel in the family of the two or more types of channels with another bit position indicated in a second information set corresponding to a second channel in the family of two or more types of channels.

4. The transmit node of claim 1, wherein the one or more first polar encoders is operable to encode the plurality of information bits at a first code rate $r_1$ to provide a number ni of coded bits, where $n_1 = k/r_1$ is the number of information bits in the plurality of information bits.

5. The transmit node of claim 4, further comprising:
 a second universal rate-compatible polar encoder, the second universalization polar encoder comprising:
 a second universalization precoder operable to receive the plurality of information bits and perform a polarization step a number of times (t-times); and
 one or more second polar encoders operable to encode a subset of the plurality of information bits at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$; and
 a concatenator operable to selectively concatenate an output of the first universal rate-compatible polar encoder and an output of a second universal rate-compatible polar encoder to provide the plurality of coded bits at a desired code rate.

6. The transmit node of claim 5, wherein the first universal rate-compatible polar encoder and the second universal rate-compatible polar encoder are each operable to:

encode the plurality of information bits based on corresponding polar code generator matrices for rates $r_i$ and lengths $n_i$, where:
 $i = \{1, \ldots, T\}$, where T is a positive integer greater than or equal to 2;
 $n_1$ is a length for rate $r_1$ and, for all other values of i, $n_i$ is a number of additional coded bits to transform a code word for rate $r_{i-1}$ into a code word for rate $r_i$, i.e., $$n_i = \begin{cases} \dfrac{k}{r_i}, & \text{for } i = 1 \\ \dfrac{k}{r_i} - \sum_{j=1}^{i-1} n_j, & \text{for } i > 1 \end{cases}$$

where k is the number of information bits in the plurality of information bits;

$$\sum_{i=1}^{T} n_i = n,$$

where n is a maximum code word length of the plurality of coded bits (i.e., $n = k/n_T$); and
$r_i > r_{i+1}$ for $i=1, \ldots, T-1$; and
a concatenator operable to selectively concatenate outputs of the plurality of polar encoders to provide the plurality of coded bits at a desired code rate $r_{desired}$ such that, for the desired code rate $r_{desired}$, the plurality of coded bits is a concatenation of the outputs of the plurality of polar encoders (24, 28) for rates $r_1, \ldots, r_{desired}$.

7. The transmit node of claim 6 wherein the polar code generator matrices for the plurality of polar encoders are submatrices $$G_{n_i}^{A_i}([1:r_i n_i])$$

of row-permuted generator matrices of i-th polar codes $$(G_{n_i}^{A_i})$$

consisting of a first row ($r_i$) through a second row ($r_i n_i$) of $$G_{n_i}^{A_i}.$$

8. The transmit node of claim 1, wherein the one or more first polar encoders comprises:
 a first polar encoder for rate $r_1$ operable to encode the plurality of information bits at the rate $r_1$ to provide $n_1$ coded bits; and
 one or more additional polar encoders, each additional polar encoder operable to encode a subset of the plurality of information bits consisting of a number $r_i n_i$ of the plurality of information bits at the rate $r_i$ to provide $n_i$ coded bits.

9. The transmit node of claim 8, wherein, for each of the one or more additional polar encoders, the subset of the plurality of information bits encoded by the additional polar encoder is different than the subsets encoded by the other additional polar encoders.

10. The transmit node of claim 8 wherein, for each of the one or more additional polar encoders, the subset of the plurality of information bits encoded by the additional polar encoder comprises a predefined number of the plurality of information bits that are most unreliable with respect to transmission of the number $n_1$ of coded bits from the first polar encoder.

11. The transmit node of claim 8 wherein, for at least one of the one or more additional polar encoders, an ordering of the subset of the plurality of information bits encoded by the at least one of the one or more additional polar encoders is different than an ordering of those same information bits when encoded by the first polar encoder.

12. A transmit node in a wireless communications system, comprising:
 a first universal rate-compatible polar encoder configured for a family of two or more types of channels, the first universal rate-compatible polar encoder operable to encode a plurality of information bits to provide a plurality of coded bits;
 a transmitter operable to transmit the plurality of coded bits to a receive node; and
 at least one processor operable to:
 select an initial code rate;
 perform, via the first universal rate-compatible polar encoder, polar encoding of the plurality of information bits at the initial code rate;
 transmit the plurality of coded bits, having been encoded at the initial code rate;
 upon receiving a negative acknowledgement from a receive node for the transmission of the plurality of coded bits, select a new code rate for an incremental redundancy retransmission;
 perform, via the first universal rate-compatible polar encoder, polar encoding of some of the plurality of coded bits to provide additional coded bits for the new code rate; and
 transmit the additional coded bits.

13. The transmit node of claim 1, wherein the transmit node comprises a network node.

14. The transmit node of claim 1, wherein the transmit node comprises a wireless device.

15. A method by a transmit node in a wireless communications system, comprising:
 encoding, by a first universal rate-compatible polar encoder configured for a family of two or more types of channels, a plurality of information bits to provide a plurality of coded bits wherein encoding by the first universal rate-compatible pole encoder comprises:
 receiving, by a first universalization precoder, the plurality of information bits and performing a polarization step a number of times (t-times); and
 receiving, by one or more first polar encoders, a plurality of precoded bits from the first universalization precoder and outputting a plurality of coded bits; and transmitting the plurality of coded bits to a receive node.

16. The method of claim 15, wherein the number of times (t-times) that the polarization step is performed is customized for a collection of two or more information sets, each information set corresponding to a member in the family of two or more types of channel.

17. The method of claim 16, wherein each of the one or more (t-times) that the polarization step is performed comprises XORing a bit located in a position indicated in a first information set corresponding to a first channel in the family of the two or more types of channels with another bit position indicated in a second information set corresponding to a second channel in the family of two or more types of channels.

18. The method of claim 15, further comprising: encoding, by the one or more first polar encoders, the plurality of information bits at a first code rate $r_1$ to provide a number $n_1$ of coded bits, where $n_1 = k/r_1$ and k is the number of information bits in the plurality of information bits.

19. The method of claim 18, further comprising:
 encoding, by a second universal rate-compatible polar encoder, the plurality of information bits to provide the plurality of coded bits, wherein encoding by the second universal rate-compatible polar encoder comprises:
 receiving, by a second universalization precoder, the plurality of information bits and performing a polarization step a number of times (t-times); and
 encoding, by one or more second polar encoders, a subset of the plurality of information bits at a second code rate $r_2$ to provide a number $n_2$ of coded bits, where $r_1 > r_2$ and the number $n_2$ of coded bits is a number of coded bits that, when concatenated with the number $n_1$ of coded bits, transforms a resulting code word from the first code rate $r_1$ to the second code rate $r_2$; and
 selectively concatenating an output of the first universal rate-compatible polar encoder and an output of a second universal rate-compatible polar encoder to provide the plurality of coded bits at a desired code rate.

20. The method of claim 19, wherein the first universal rate-compatible polar encoder and the second universal rate-compatible polar encoder are each operable to:
 encode the plurality of information bits based on corresponding polar code generator matrices for rates $r_i$ and lengths $n_i$, where:
 $i = \{1, \ldots, T\}$, where T is a positive integer greater than or equal to 2;
 $n_1$ is a length for rate $r_1$ and, for all other values of i, $n_i$ is a number of additional coded bits to transform a code word for rate $r_{i-1}$ into a code word for rate $r_i$, i.e., $$n_i = \begin{cases} \dfrac{k}{r_i}, & \text{for } i = 1 \\ \dfrac{k}{r_i} - \sum_{j=1}^{i-1} n_j, & \text{for } i > 1 \end{cases}$$

where k is the number of information bits in the plurality of information bits;

$$\sum_{i=1}^{T} n_i = n,$$

where n is a maximum code word length of the plurality of coded bits (i.e., $n = k/n_T$); and
 $r_i > r_{i+1}$ for $i = 1, \ldots, T-1$; and
 wherein the method further comprises selectively concatenating outputs of the plurality of polar encoders to provide the plurality of coded bits at a desired code rate $r_{desired}$ such that, for the desired code rate $r_{desired}$, the plurality of coded bits is a concatenation of the outputs of the plurality of polar encoders (24, 28) for rates $r_1, \ldots, r_{desired}$.

21. The method of claim 20 wherein the polar code generator matrices for the plurality of polar encoders are submatrices $$G_{n_i}^{A_i}([1:r_i n_i])$$

of row-permuted generator matrices of i-th polar codes $$(G_{n_i}^{A_i})$$

consisting of a first row ($r_i$) through a second row ($r_i n_i$) of $$G_{n_i}^{A_i}.$$

22. The method of claim 15, further comprising:
encoding, by a first polar encoder of the one or more first polar encoders, the plurality of information bits at a first rate $r_1$ to provide $n_1$ coded bits; and
encoding, by one or more additional polar encoders of the one or more first polar encoders, a subset of the plurality of information bits consisting of a number $r_i n_i$ of the plurality of information bits at the rate $r_i$ to provide $n_i$ coded bits.

23. The method of claim 22, wherein, for each of the one or more additional polar encoders, the subset of the plurality of information bits encoded by the additional polar encoder is different than the subsets encoded by the other additional polar encoders.

24. The method of claim 22 wherein, for each of the one or more additional polar encoders, the subset of the plurality of information bits encoded by the additional polar encoder comprises a predefined number of the plurality of information bits that are most unreliable with respect to transmission of the number $n_1$ of coded bits from the first polar encoder.

25. The method of claim 22 wherein, for at least one of the one or more additional polar encoders, an ordering of the subset of the plurality of information bits encoded by the at least one of the one or more additional polar encoders is different than an ordering of those same information bits when encoded by the first polar encoder.

26. A method by a transmit node in a wireless communications system, comprising:
encoding, by a first universal rate-compatible polar encoder configured for a family of two or more types of channels, a plurality of information bits to provide a plurality of coded bits;
transmitting the plurality of coded bits to a receive node;
selecting an initial code rate;
performing, via the first universal rate-compatible polar encoder, polar encoding of the plurality of information bits at the initial code rate;
transmitting the plurality of coded bits, having been encoded at the initial code rate;
upon receiving a negative acknowledgement from a receive node for the transmission of the plurality of coded bits, selecting a new code rate for an incremental redundancy retransmission;
performing, via the first universal rate-compatible polar encoder, polar encoding of some of the plurality of coded bits to provide additional coded bits for the new code rate; and
transmitting the additional coded bits.

27. The method of claim 15, wherein the transmit node comprises a network node.

28. The method of claim 15, wherein the transmit node comprises a wireless device.

* * * * *